US008633592B2

(12) United States Patent
Lee et al.

(10) Patent No.: US 8,633,592 B2
(45) Date of Patent: Jan. 21, 2014

(54) HYBRID INTERCONNECT TECHNOLOGY

(75) Inventors: Michael G. Lee, Saratoga, CA (US);
Chihiro Uchibori, Campbell, CA (US)

(73) Assignee: Cisco Technology, Inc., San Jose, CA (US)

( * ) Notice: Subject to any disclaimer, the term of this patent is extended or adjusted under 35 U.S.C. 154(b) by 51 days.

(21) Appl. No.: 13/190,761

(22) Filed: Jul. 26, 2011

(65) Prior Publication Data

US 2013/0026634 A1  Jan. 31, 2013

(51) Int. Cl.
*H01L 23/48* (2006.01)

(52) U.S. Cl.
USPC ........... 257/762; 257/779; 257/780; 257/781; 257/782; 257/783; 257/784; 257/785; 257/786

(58) Field of Classification Search
USPC .................. 257/779–786, E23.001–E23.194; 438/128–132, 598, 618
See application file for complete search history.

(56) References Cited

U.S. PATENT DOCUMENTS

| | | | |
|---|---|---|---|
| 7,202,569 B2 * | 4/2007 | Tomono ........................ | 257/772 |
| 2003/0126578 A1 * | 7/2003 | Wadland et al. ................ | 716/12 |
| 2005/0214971 A1 * | 9/2005 | Hung ............................. | 438/106 |
| 2006/0033214 A1 * | 2/2006 | Tomono ........................ | 257/772 |
| 2008/0212067 A1 * | 9/2008 | Gupta ........................... | 356/35.5 |
| 2009/0108443 A1 | 4/2009 | Jiang | |
| 2011/0037156 A1 * | 2/2011 | Chandrasekaran et al. .. | 257/686 |
| 2011/0121464 A1 * | 5/2011 | Pendse .......................... | 257/775 |
| 2012/0228754 A1 * | 9/2012 | Liu et al. ....................... | 257/676 |

FOREIGN PATENT DOCUMENTS

WO        WO 97/41594        11/1997

OTHER PUBLICATIONS

PCT Notification of Transmittal of the International Search Report and The Written Opinion of the International Searching Authority, or the Declaration; dated Feb. 25, 2013; International Application No. PCT/US2012/047832.
C.J. Uchibori et al; "*Impact of Cu/low-k Interconnect Design on Chip Package Interaction in Flip Chip Package*;" AIP Conference Proceedings, vol. 1143, Jan. 1, 2009; pp. 185-196, XP055053451.
Alluru, K et al; "Direct simulation of fatigue failure in solder joints during cyclic shear;" Materials and Design, London, GB; vol. 32, No. 4; Nov. 30, 2010; pp. 1940-1947; XP028132426.

* cited by examiner

*Primary Examiner* — Steven Loke
*Assistant Examiner* — Junaiden Mirsalahuddin
(74) *Attorney, Agent, or Firm* — Baker Botts L.L.P.

(57) ABSTRACT

In one embodiment, an interconnect structure between an integrated circuit (IC) chip and a substrate comprises a plurality of materials.

13 Claims, 5 Drawing Sheets

HYBRID INTERCONNECT TECHNOLOGY

TECHNICAL FIELD

This disclosure generally relates to integrated circuit packaging.

BACKGROUND

Integrated circuit (IC) packaging may be considered the final stage of semiconductor device fabrication. During this step of the fabrication process, IC chips are mounted on substrates, forming IC packages. Examples of different types of IC packages include dual in-line package (DIP), pin grid array (PGA) package, leadless chip carrier (LCC) package, surface mount package, small-outline integrated circuit (SOIC) package, plastic leaded chip carrier (PLCC) package, plastic quad flat pack (PQFP) package, thin small-outline package (TSOP), and ball grid array (BGA) package. In a flip-chip ball grid array (FCBGA) package, a chip is flipped upside down and bonded to the BGA substrate.

DESCRIPTION OF EXAMPLE EMBODIMENTS

Figure 1:
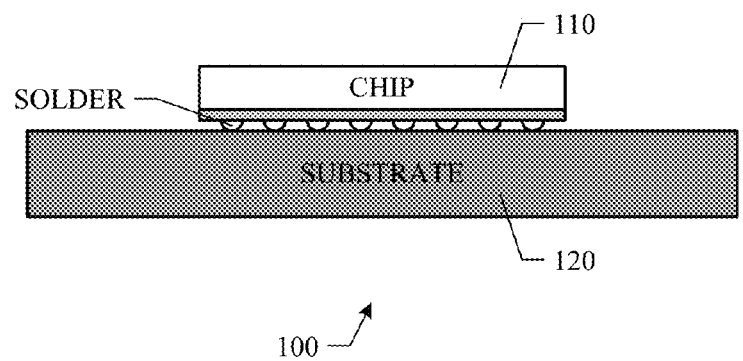
FIG. 1 illustrates an example IC package at bonding temperature.

During the stage of integrated circuit (IC) packaging, IC chips are mounted on substrates using various suitable mounting techniques to form IC packages. FIG. 1 illustrates an example IC package 100 that has an IC chip 110 mounted on a substrate 120. IC chip 110 may be constructed of silicon, and substrate 120 may be constructed of ceramic or plastic. In particular embodiments, IC chip 110 may be soldered on substrate 120, and the solder material may be tin-lead, tin-silver, etc.

A particular material has various properties, including thermal expansion and Young's modulus. Thermal expansion is the tendency of matter to change in volume in response to a change in temperature. For example, a material may expand when heated up and contract when cooled down. The amount of thermal expansion of each material may be measured by its coefficient of thermal expansion (CTE), which is defined as the degree of expansion in the material divided by the change in temperature. When force is applied to a solid object, the object may experience stress, which may be measured as the ratio of the applied force and the cross section area of the object. Strain is the deformation of a solid object due to stress. Stress and strain experienced by a solid object may be represented using a stress-strain curve. In solid mechanics, the slope of a stress-strain curve at any point is called the tangent modulus. The tangent modulus of the initial, linear portion of a stress-strain curved is called Young's modulus (named after Thomas Young, the 19th century British scientist), also known as the tensile modulus, which is defined as the ratio of the uniaxial stress over the uniaxial strain in the range of stress in which Hooke's Law holds.

Figure 2:
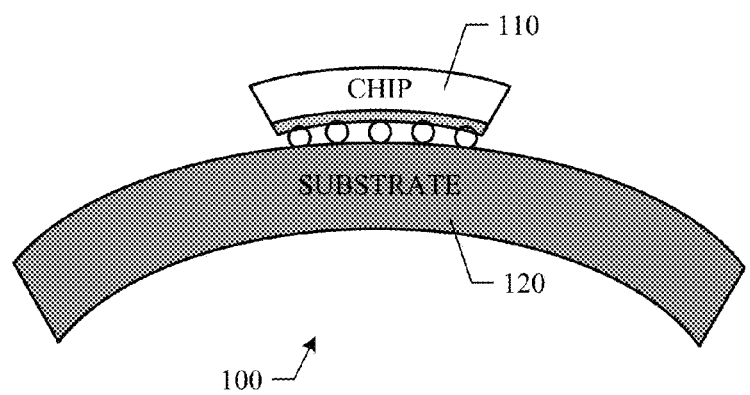
FIG. 2 illustrates an example IC package after cooling down.

Different materials have different CTEs. Similarly, objects made of different materials have different tangent moduli and thus different stress-strain curves. For example, in FIG. 1, because silicon has relatively low CTE, IC chip 110 expands only slightly when heated up (e.g., during the soldering process). On the other hand, plastic has relatively high CTE, and thus substrate 120 expands much more when heated up. Consequently, when IC chip 110 and substrate 120 are both cooled down, IC chip 110 contracts much less than substrate 120, as illustrated in FIG. 2. This results in thermomechanical stress in IC package 100. The thermomechanical stress becomes progressively higher when IC chip 110 is cooled down from the bounding temperature (e.g., during the bonding) toward the room temperatures.

Figure 3:
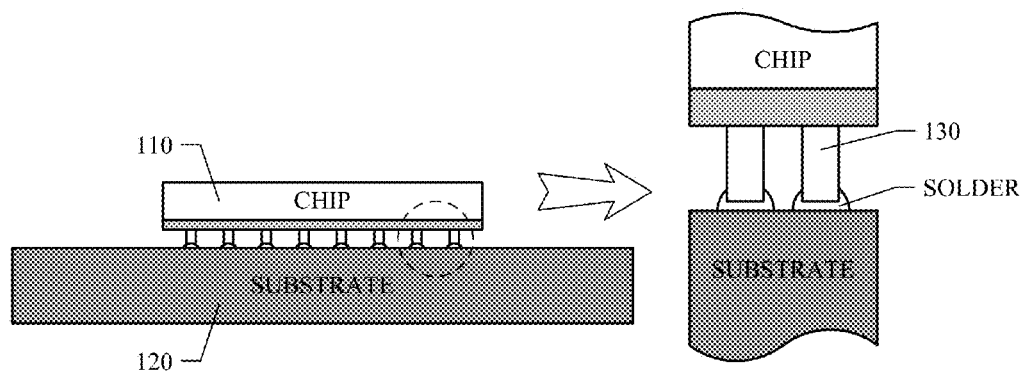
FIG. 3 illustrates an example pillar packaging.

One type of IC packaging in flip-chip technology is pillar packaging, as illustrated in FIG. 3. With pillar packaging, in particular embodiments, a number of interconnect structures 130, also referred to as pillars, may be formed on IC chip 110. The other end of each interconnect structure 130 is soldered to substrate 120. Alternatively, in particular embodiments, a number of interconnect structures 130 may be formed on substrate 130, and the other end of each interconnect structure 130 is soldered to IC chip 110.

In particular embodiments, each interconnect structure 130 is constructed with a single material, such as copper. Copper pillar packaging offers advantages in fine pitch, since copper does not collapse into spherical shape during bonding. However, copper has a much higher tangent modulus than typical solder materials such as tin-silver, and so copper pillar packaging tends to induce higher thermomechanical stress than conventional solder bump packaging.

Particular embodiments construct each interconnect structure between an IC chip and a substrate using multiple materials instead of a single material. Such interconnect structures may be referred to as hybrid interconnect structures. Any number of different materials may be used to construct an interconnect structure. Particular embodiments may select the different materials to be complementary to each other in terms of their properties and characteristics, such as their CTEs and tangent moduli. For example, if an interconnect structure is constructed with two different materials, one material may have a relatively high CTE and the other material may have a relatively low CTE, or one material may have a relatively high rigidity and the other material may have a relatively low rigidity. The combination of multiple materials may help reduce thermomechanical stress on the IC chip. Particular embodiments may reduce the thermomechanical stress by optimizing spatial locations for the materials used.

Figure 4:
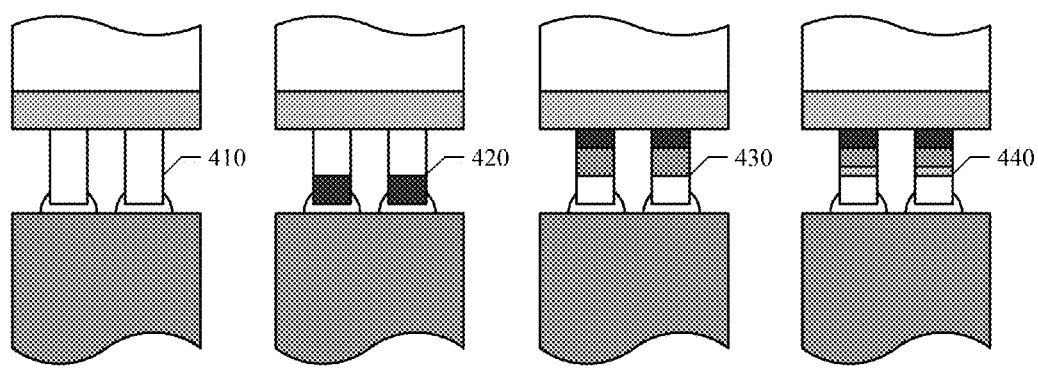
FIG. 4 illustrates example interconnect structures.

FIG. 4 illustrates examples of interconnect structures constructed of different materials. Interconnect structure 410 is constructed of a single material, such as, for example and without limitation, copper (e.g., produced by electroplating). Interconnect structure 420 is constructed of two different materials, such as, for example and without limitation, copper for the first material and gold, copper-tin alloy, or tin-silver alloy (e.g., produced by electroplating) for the second material. Interconnect structure 430 is constructed of three different materials. Interconnect structure 440 is constructed of four different materials. Note that within a single interconnect structure, there may be different amounts of the different materials.

Figure 5:
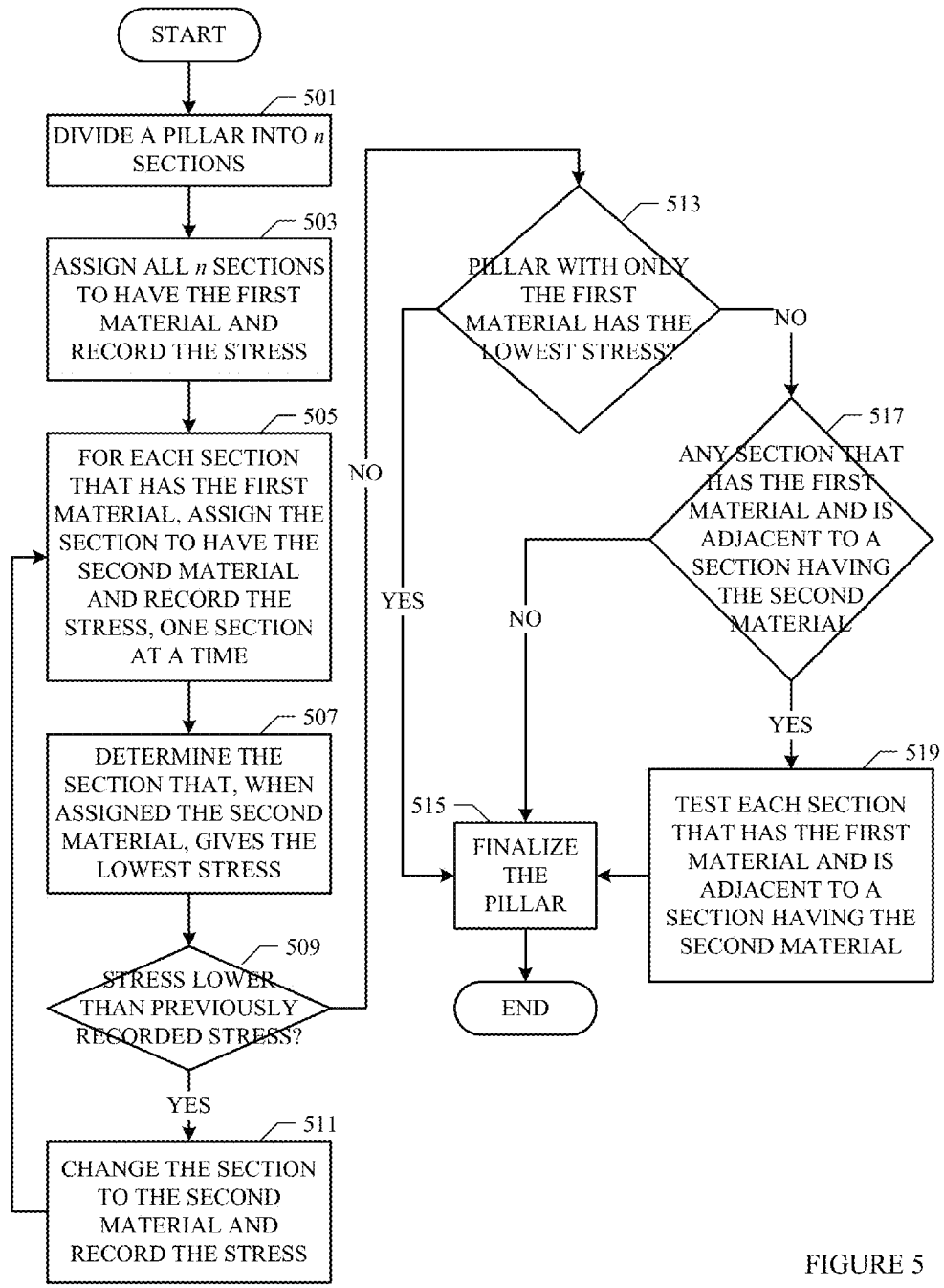
FIG. 5 illustrates an example method for constructing an interconnect structure having two different materials.
Figure 6:
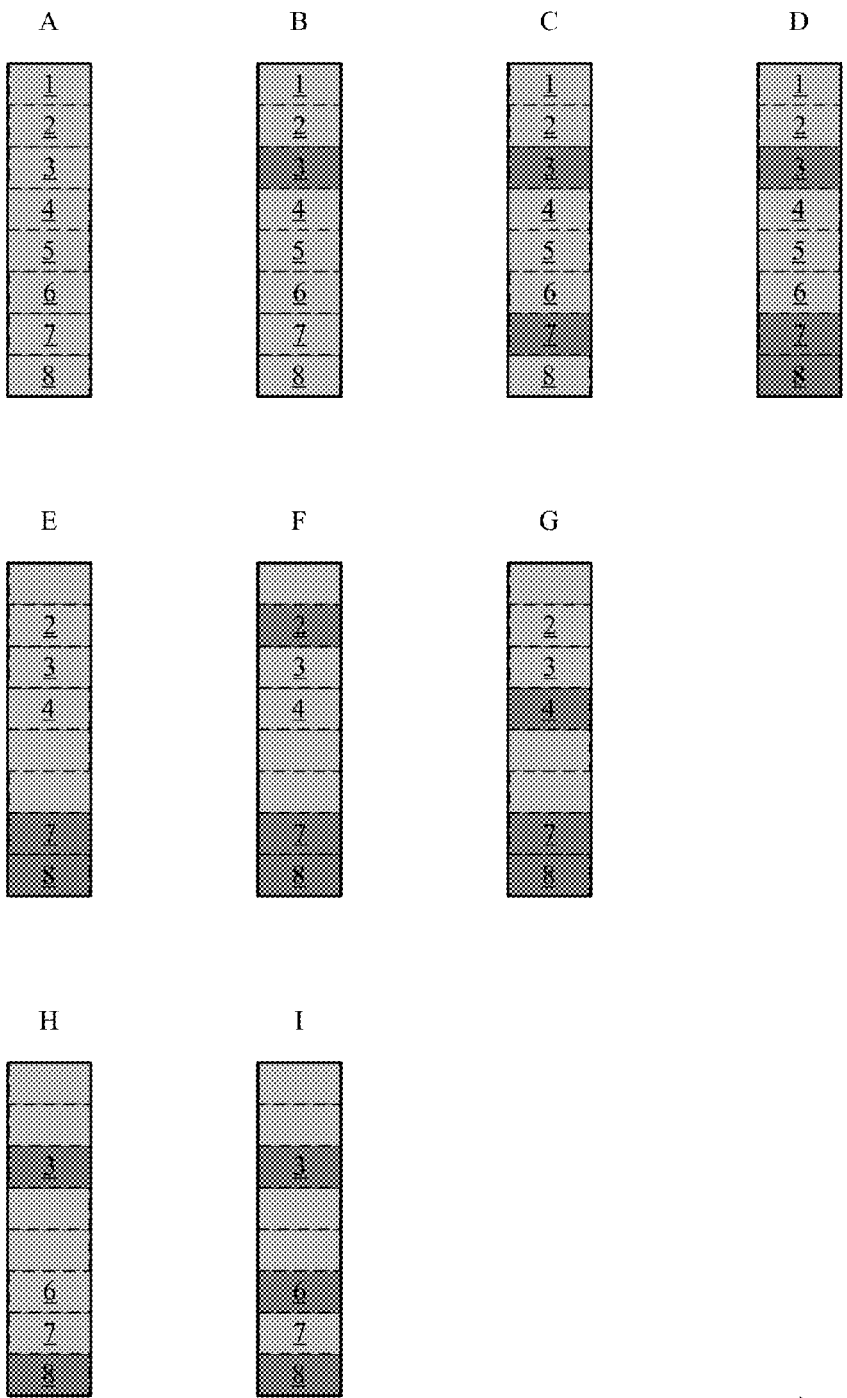
FIG. 6 illustrates an example interconnect structure having two different materials.

FIG. 5 illustrates an example method for constructing an interconnect structure using two different materials. Although FIG. 5 only illustrates the case with two materials, the process may be similarly applied to the cases of constructing interconnect structures having more than two materials. FIG. 6 illustrates an example interconnect structure 600, which is used to help explain the steps illustrated in FIG. 5.

Given an interconnect structure, particular embodiments may divide the interconnect structure into n sections, as illustrated in STEP 501. The n sections may or may not have the equal thickness. In particular embodiments, n is a number greater than 1, and may be chosen based on experiments. If n is too large (e.g., greater than 100), the process may require long computation time. If n is too small (e.g., less than or equal to 4), the final result may not be satisfactory. In particular embodiments, n may be a number divisible by 2 (e.g., 6, 8, 10, . . . ). In particular embodiments, the more number of materials used to construct the interconnect structure, the larger n is preferred. Based on experiments, for two materials, a number between 10 and 20 (e.g., 12) may be a good choice for n. For illustrative purposes, interconnect structure 600 is divided into eight sections, as illustrated in FIG. 6A.

Particular embodiments may assign all n sections of the interconnect structure to a first material (e.g., copper), as illustrated in STEP 503. For interconnect structure 600, all eight sections of are assigned the same first material (FIG. 6A). Particular embodiments may then record the current stress level corresponding to the interconnect structure (i.e., the stress level corresponding to the interconnect structure with all n sections assigned the same first material), as illustrated in STEP 503. In some implementations, the stress level to be recorded is at the location where fracture may occur (e.g., the integrated circuits on the chip or the pillar itself).

For each of the n sections that has the first material, particular embodiments may assign the section the second material, one section at a time, and determine the stress level corresponding to the interconnect structure with the current configuration, as illustrated in STEP 505. For interconnect structure 600, at this point, all eight sections have the first material (FIG. 6A). First, only section 1 is replaced with the second material and sections 2-8 still have the first material, and the stress level corresponding to this configuration for interconnect structure 600 is determined. Second, only section 2 is replaced with the second material and sections 1 and 3-8 still have the first material, and the stress level corresponding to this configuration for interconnect structure 600 is determined. Third, only section 3 is replaced with the second material and sections 1-2 and 4-8 still have the first material, and the stress level corresponding to this configuration for interconnect structure 600 is determined. And so on, until finally, only section 8 is replaced with the second material and sections 1-7 still have the first material, and the stress level corresponding to this configuration for interconnect structure 600 is determined. There are eight different configurations, and thus eight different stress levels are determined.

Particular embodiments may determine the section that, when assigned the second material, gives the lowest stress level for the interconnect structure among the above cases of STEP 505, as illustrated in STEP 507. In other words, the configuration that has the lowest stress level among the above cases of STEP 505 is determined. For example, suppose that for interconnect structure 600, among the above eight configurations, the configuration where section 3 has the second material and sections 1-2 and 4-8 have the first material (FIG. 6B) gives the lowest stress level.

Particular embodiments may compare this currently-lowest stress level with the previously-recorded stress level to determine if this currently-lowest stress level is less than the previously-recorded stress level, as illustrated in STEP 509. For interconnect structure 600, the stress level corresponding to the configuration where section 3 has the second material and sections 1-2 and 4-8 have the first material (i.e., the currently-lowest stress level, FIG. 6B) is compared with the stress level corresponding to the configuration where all eight sections have the first material (i.e., the previously-recorded stress level, FIG. 6A).

If the currently-lowest stress level is less than the previously-recorded stress level (STEP 509—"YES"), particular embodiments may change the section that corresponds to the currently-lowest stress level to the second material, and record the currently-lowest stress level, as illustrated in STEP 511. For interconnect structure 600, suppose that the stress level corresponding to the configuration where section 3 has the second material and sections 1-2 and 4-8 have the first material (FIG. 6B) is lower than the stress level corresponding to the configuration where all eight sections have the first material (FIG. 6A). Section 3 is changed to the second material (FIG. 6B), and the stress level corresponding to this configuration is recorded.

Particular embodiments may then repeat STEPS 505, 507, 509, and 511 for another iteration. For interconnect structure 600, at the beginning of the second iteration, section 3 already has the second material and sections 1-2 and 4-8 still have the first material (FIG. 6B), and the stress level corresponding to this configuration has been recorded. At this point, there are seven sections still having the first material. Each section that still has the first material is assigned the second material, one section at a time, and the stress level corresponding to each configuration is determined (STEP 505). First, only section 1 is replaced with the second material and sections 2 and 4-8 still have the first material (section 3 already has the second material), and the stress level corresponding to this configuration for interconnect structure 600 is determined. Second, only section 2 is replaced with the second material and sections 1 and 4-8 still have the first material (section 3 already has the second material), and the stress level corresponding to this configuration for interconnect structure 600 is determined. Third, only section 4 is replaced with the second material and sections 1-2 and 5-8 still have the first material (section 3 already has the second material), and the stress level corresponding to this configuration for interconnect structure 600 is determined. And so on. For the second iteration, there are seven sections (i.e., sections 1-2 and 4-8) having the first material, and thus there are seven different configurations and seven corresponding stress levels. The configuration with the currently-lowest stress level among the seven configurations is determined (STEP 507). Suppose that the configuration where sections 3 and 7 have the second material and sections 1-2 and 4-6 and 8 have the first material (FIG. 6C) gives the currently-lowest stress level. This currently-lowest stress level is compared with the previously-recorded stress level (i.e., the stress level corresponding to the configuration where section 3 has the second material and sections 1-2 and 4-8 have the first material (FIG. 6B)).

Suppose that for interconnect structure 600, the currently-lowest stress level corresponding to the configuration where sections 3 and 7 have the second material and sections 1-2 and 4-6 and 8 have the first material (FIG. 6C) is lower than the previously-recorded stress level corresponding to the configuration where section 3 has the second material and sections 1-2 and 4-8 have the first material (FIG. 6B). Section 7 is now changed to the second material (FIG. 6C), and stress level corresponding to this configuration is recorded (STEP 511).

STEPS 505, 507, 509, and 511 may be repeated once again. For interconnect structure 600, at the beginning of the third iteration, sections 3 and 7 already have the second material and sections 1-2 and 4-6 and 8 still have the first material (FIG. 6C), and the stress level corresponding to this configuration has been recorded. At this point, there are six sections still having the first material. Each section that still has the first material is assigned the second material, one section at a time, and the stress level corresponding to each configuration is determined (STEP 505). First, only section 1 is replaced with the second material and sections 2 and 4-6 and 8 still have the first material (sections 3 and 7 already have the second material), and the stress level corresponding to this configuration for interconnect structure 600 is determined. Second, only section 2 is replaced with the second material and sections 1 and 4-6 and 8 still have the first material (sections 3 and 7 already have the second material), and the stress level corresponding to this configuration for interconnect structure 600 is determined. Third, only section 4 is replaced with the second material and sections 1-2 and 5-6 and 8 still have the first material (sections 3 and 7 already have the second material), and the stress level corresponding to this configuration for interconnect structure 600 is determined. And so on. For the third iteration, there are six sections (i.e., sections 1-2 and 4-6 and 8) having the first material, and thus there are six different configurations and six corresponding stress levels. The configuration with the currently-lowest stress level among the six configurations is determined (STEP 507). Suppose that the configuration where sections 3 and 7-8 have the second material and sections 1-2 and 4-6 have the first material (FIG. 6D) gives the currently-lowest stress level. This currently-lowest stress level is compared with the previously-recorded stress level (i.e., the stress level corresponding to the configuration where sections 3 and 7 have the second material and sections 1-2 and 4-6 and 8 have the first material (FIG. 6C)).

Suppose that for interconnect structure 600, the currently-lowest stress level corresponding to the configuration where sections 3 and 7-8 have the second material and sections 1-2 and 4-6 have the first material (FIG. 6D) is lower than the previously-recorded stress level corresponding to the configuration where sections 3 and 7 have the second material and sections 1-2 and 4-6 and 8 have the first material (FIG. 6C). Section 8 is now changed to the second material (FIG. 6D), and stress level corresponding to this configuration is recorded (STEP 511).

STEPS 505, 507, 509, and 511 may be repeated once again. For interconnect structure 600, at the beginning of the fourth iteration, sections 3 and 7-8 already have the second material and sections 1-2 and 4-6 still have the first material (FIG. 6D), and the stress level corresponding to this configuration has been recorded. At this point, there are five sections still having the first material. Each section that still has the first material is assigned the second material, one section at a time, and the stress level corresponding to each configuration is determined (STEP 505). First, only section 1 is replaced with the second material and sections 2 and 4-6 still have the first material (sections 3 and 7-8 already have the second material), and the stress level corresponding to this configuration for interconnect structure 600 is determined. Second, only section 2 is replaced with the second material and sections 1 and 4-6 still have the first material (sections 3 and 7-8 already have the second material), and the stress level corresponding to this configuration for interconnect structure 600 is determined. Third, only section 4 is replaced with the second material and sections 1-2 and 5-6 still have the first material (sections 3 and 7-8 already have the second material), and the stress level corresponding to this configuration for interconnect structure 600 is determined. And so on. For the fourth iteration, there are five sections (i.e., sections 1-2 and 4-6) having the first material, and thus there are five different configurations and five corresponding stress levels. The configuration with the currently-lowest stress level among the five configurations is determined (STEP 507). Suppose that the configuration where sections 3-4 and 7-8 have the second material and sections 1-2 and 5-6 have the first material gives the currently-lowest stress level. This currently-lowest stress level is compared with the previously-recorded stress level (i.e., the stress level corresponding to the configuration where sections 3 and 7-8 have the second material and sections 1-2 and 4-6 have the first material (FIG. 6D)).

Suppose that for interconnect structure 600, the currently-lowest stress level corresponding to the configuration where sections 3-4 and 7-8 have the second material and sections 1-2 and 5-6 have the first material is higher than or equal to the previously-recorded stress level corresponding to the configuration where sections 3 and 7-8 have the second material and sections 1-2 and 4-6 have the first material (FIG. 6D). In particular embodiments, the iterative process ends (STEP 509—"NO"). Note that section 4 is not changed to the second material, because doing so does not help lower the stress level corresponding to interconnect structure 600.

Note that during each iteration, the number of sections that currently have the first material is always less than or equal to n. That is, if there are m sections currently having the first material during each iteration, then m≤n.

Particular embodiments may verify that whether, at the point when the iterative process (STEPS 505, 507, 509, 511) ends, all n sections of the interconnect structure still have the same first material, as illustrated in STEP 513. If so (STEP 513—"YES"), this means that the interconnect structure having only the first material (e.g., FIG. 6A) gives the lowest stress level. Particular embodiments may then finalize the interconnect structure so that it is constructed with only the first material (i.e., no combination of multiple materials), as illustrated in STEP 515. On the other hand (STEP 513—"NO"), particular embodiments may determine if there is any section that has the first material and is adjacent to a section that has the second material, as illustrated in STEP 517. If so (STEP 517—"YES"), particular embodiments may further test each such section, as illustrated in STEP 519.

In particular embodiments, larger numbers of sections may provide better results. However, larger numbers of sections often require longer computation time. Thus, particular embodiments may further test those sections that still have the first material and are adjacent to the sections that have the second material to ensure the quality of the final results, especially when n is relatively small.

For interconnect structure 600, at the end of the iterative process, sections 3 and 7-8 have the second material and sections 1-2 and 4-6 have the first material (FIG. 6D), and the stress level corresponding to this configuration has been recorded. In this case, not all eight sections still have the first material. In addition, sections 2 and 4, which have the first material, are adjacent to section 3, which has the second material. Section 6, which has the first material, is adjacent to section 7, which has the second material. Thus, each of sections 2, 4, and 6 needs to be tested.

First, considering sections 2 and 4 adjacent to section 3. To independently test sections 2 and 4 in connection with section 3, section 3 is reverted back to the first material (FIG. 6E). Section 2 is assigned the second material (FIG. 6F), and the stress level corresponding to this configuration is determined. Then, section 2 is reverted back to the first material, and section 4 is assigned the second material (FIG. 6G), and the stress level corresponding to this configuration is determined.

The three stress levels of the three configurations of FIGS. 6D, 6F, and 6G, respectively, are compared to each other, and the configuration with the lowest stress level among the three is selected and its corresponding stress level is recorded.

Second, considering section 6 adjacent to section 7. To independently test section 6 in connection with section 7, section 7 is reverted back to the first material (FIG. 6H). Section 6 is assigned the second material (FIG. 6I), and the stress level corresponding to this configuration is determined. This stress level may be compared with the stress level corresponding to the configuration of FIG. 6D, and the configuration with the lower stress level is selected and its corresponding stress level is recorded.

For interconnect structure 600, the effect of STEP 519 is that the four stress levels of the four configurations illustrated in FIGS. 6D, 6F, 6G, and 6I, respectively, are compared to each other, and the configuration with the lowest stress level among the four is selected. This configuration is the final result for interconnect structure 600.

Figure 7:
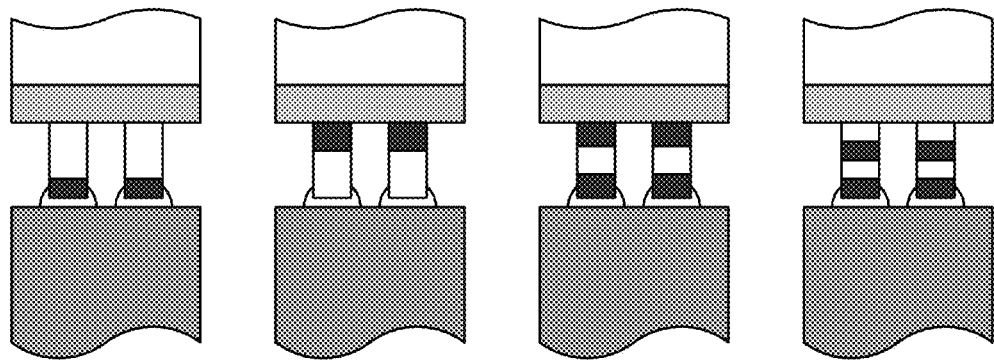
FIG. 7 illustrates example interconnect structures having two different materials.

For different interconnect structures, the process illustrated in FIG. 5 may result in different configurations of the two materials. Several example configurations of the interconnect structures constructed using two materials are illustrated in FIG. 7. Note that there may be different amounts of the two materials within an interconnect structure, and the two materials may alternate among the sections of an interconnect structure.

Figure 8:
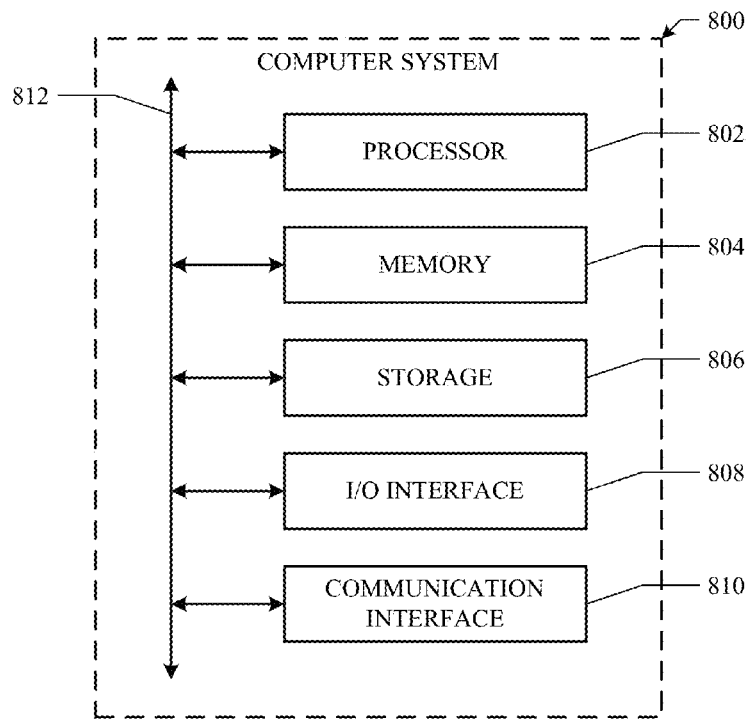
FIG. 8 illustrates an example computer system.

Particular embodiments may be implemented on one or more computer systems. In particular embodiments, the process illustrated in FIG. 5 may be implemented as computer software stored in non-transitory computer-readable medium and executed on the computer systems. FIG. 8 illustrates an example computer system 800. In particular embodiments, one or more computer systems 800 perform one or more steps of one or more methods described or illustrated herein. In particular embodiments, one or more computer systems 800 provide functionality described or illustrated herein. In particular embodiments, software running on one or more computer systems 800 performs one or more steps of one or more methods described or illustrated herein or provides functionality described or illustrated herein. Particular embodiments include one or more portions of one or more computer systems 800.

This disclosure contemplates any suitable number of computer systems 800. This disclosure contemplates computer system 800 taking any suitable physical form. As example and not by way of limitation, computer system 800 may be an embedded computer system, a system-on-chip (SOC), a single-board computer system (SBC) (such as, for example, a computer-on-module (COM) or system-on-module (SOM)), a desktop computer system, a laptop or notebook computer system, an interactive kiosk, a mainframe, a mesh of computer systems, a mobile telephone, a personal digital assistant (PDA), a server, or a combination of two or more of these. Where appropriate, computer system 800 may include one or more computer systems 800; be unitary or distributed; span multiple locations; span multiple machines; or reside in a cloud, which may include one or more cloud components in one or more networks. Where appropriate, one or more computer systems 800 may perform without substantial spatial or temporal limitation one or more steps of one or more methods described or illustrated herein. As an example and not by way of limitation, one or more computer systems 800 may perform in real time or in batch mode one or more steps of one or more methods described or illustrated herein. One or more computer systems 800 may perform at different times or at different locations one or more steps of one or more methods described or illustrated herein, where appropriate.

In particular embodiments, computer system 800 includes a processor 802, memory 804, storage 806, an input/output (I/O) interface 808, a communication interface 810, and a bus 812. Although this disclosure describes and illustrates a particular computer system having a particular number of particular components in a particular arrangement, this disclosure contemplates any suitable computer system having any suitable number of any suitable components in any suitable arrangement.

In particular embodiments, processor 802 includes hardware for executing instructions, such as those making up a computer program. As an example and not by way of limitation, to execute instructions, processor 802 may retrieve (or fetch) the instructions from an internal register, an internal cache, memory 804, or storage 806; decode and execute them; and then write one or more results to an internal register, an internal cache, memory 804, or storage 806. In particular embodiments, processor 802 may include one or more internal caches for data, instructions, or addresses. This disclosure contemplates processor 802 including any suitable number of any suitable internal caches, where appropriate. As an example and not by way of limitation, processor 802 may include one or more instruction caches, one or more data caches, and one or more translation lookaside buffers (TLBs). Instructions in the instruction caches may be copies of instructions in memory 804 or storage 806, and the instruction caches may speed up retrieval of those instructions by processor 802. Data in the data caches may be copies of data in memory 804 or storage 806 for instructions executing at processor 802 to operate on; the results of previous instructions executed at processor 802 for access by subsequent instructions executing at processor 802 or for writing to memory 804 or storage 806; or other suitable data. The data caches may speed up read or write operations by processor 802. The TLBs may speed up virtual-address translation for processor 802. In particular embodiments, processor 802 may include one or more internal registers for data, instructions, or addresses. This disclosure contemplates processor 802 including any suitable number of any suitable internal registers, where appropriate. Where appropriate, processor 802 may include one or more arithmetic logic units (ALUs); be a multi-core processor; or include one or more processors 802. Although this disclosure describes and illustrates a particular processor, this disclosure contemplates any suitable processor.

In particular embodiments, memory 804 includes main memory for storing instructions for processor 802 to execute or data for processor 802 to operate on. As an example and not by way of limitation, computer system 800 may load instructions from storage 806 or another source (such as, for example, another computer system 800) to memory 804. Processor 802 may then load the instructions from memory 804 to an internal register or internal cache. To execute the instructions, processor 802 may retrieve the instructions from the internal register or internal cache and decode them. During or after execution of the instructions, processor 802 may write one or more results (which may be intermediate or final results) to the internal register or internal cache. Processor 802 may then write one or more of those results to memory 804. In particular embodiments, processor 802 executes only instructions in one or more internal registers or internal caches or in memory 804 (as opposed to storage 806 or elsewhere) and operates only on data in one or more internal registers or internal caches or in memory 804 (as opposed to storage 806 or elsewhere). One or more memory buses (which may each include an address bus and a data bus) may couple processor 802 to memory 804. Bus 812 may include one or more memory buses, as described below. In particular embodiments, one or more memory management units (MMUs) reside between processor 802 and memory 804 and facilitate accesses to memory 804 requested by processor 802. In particular embodiments, memory 804 includes random access memory (RAM). This RAM may be volatile memory, where appropriate. Where appropriate, this RAM may be dynamic RAM (DRAM) or static RAM (SRAM). Moreover, where appropriate, this RAM may be single-ported or multi-ported RAM. This disclosure contemplates any suitable RAM. Memory 804 may include one or more memories 804, where appropriate. Although this disclosure describes and illustrates particular memory, this disclosure contemplates any suitable memory.

In particular embodiments, storage 806 includes mass storage for data or instructions. As an example and not by way of limitation, storage 806 may include an HDD, a floppy disk drive, flash memory, an optical disc, a magneto-optical disc, magnetic tape, or a Universal Serial Bus (USB) drive or a combination of two or more of these. Storage 806 may include removable or non-removable (or fixed) media, where appropriate. Storage 806 may be internal or external to computer system 800, where appropriate. In particular embodiments, storage 806 is non-volatile, solid-state memory. In particular embodiments, storage 806 includes read-only memory (ROM). Where appropriate, this ROM may be mask-programmed ROM, programmable ROM (PROM), erasable PROM (EPROM), electrically erasable PROM (EEPROM), electrically alterable ROM (EAROM), or flash memory or a combination of two or more of these. This disclosure contemplates mass storage 806 taking any suitable physical form. Storage 806 may include one or more storage control units facilitating communication between processor 802 and storage 806, where appropriate. Where appropriate, storage 806 may include one or more storages 806. Although this disclosure describes and illustrates particular storage, this disclosure contemplates any suitable storage.

In particular embodiments, I/O interface 808 includes hardware, software, or both providing one or more interfaces for communication between computer system 800 and one or more I/O devices. Computer system 800 may include one or more of these I/O devices, where appropriate. One or more of these I/O devices may enable communication between a person and computer system 800. As an example and not by way of limitation, an I/O device may include a keyboard, keypad, microphone, monitor, mouse, printer, scanner, speaker, still camera, stylus, tablet, touch screen, trackball, video camera, another suitable I/O device or a combination of two or more of these. An I/O device may include one or more sensors. This disclosure contemplates any suitable I/O devices and any suitable I/O interfaces 808 for them. Where appropriate, I/O interface 808 may include one or more device or software drivers enabling processor 802 to drive one or more of these I/O devices. I/O interface 808 may include one or more I/O interfaces 808, where appropriate. Although this disclosure describes and illustrates a particular I/O interface, this disclosure contemplates any suitable I/O interface.

In particular embodiments, communication interface 810 includes hardware, software, or both providing one or more interfaces for communication (such as, for example, packet-based communication) between computer system 800 and one or more other computer systems 800 or one or more networks. As an example and not by way of limitation, communication interface 810 may include a network interface controller (NIC) or network adapter for communicating with an Ethernet or other wire-based network or a wireless NIC (WNIC) or wireless adapter for communicating with a wireless network, such as a WI-FI network. This disclosure contemplates any suitable network and any suitable communication interface 810 for it. As an example and not by way of limitation, computer system 800 may communicate with an ad hoc network, a personal area network (PAN), a local area network (LAN), a wide area network (WAN), a metropolitan area network (MAN), or one or more portions of the Internet or a combination of two or more of these. One or more portions of one or more of these networks may be wired or wireless. As an example, computer system 800 may communicate with a wireless PAN (WPAN) (such as, for example, a BLUETOOTH WPAN), a WI-FI network, a WI-MAX network, a cellular telephone network (such as, for example, a Global System for Mobile Communications (GSM) network), or other suitable wireless network or a combination of two or more of these. Computer system 800 may include any suitable communication interface 810 for any of these networks, where appropriate. Communication interface 810 may include one or more communication interfaces 810, where appropriate. Although this disclosure describes and illustrates a particular communication interface, this disclosure contemplates any suitable communication interface.

In particular embodiments, bus 812 includes hardware, software, or both coupling components of computer system 800 to each other. As an example and not by way of limitation, bus 812 may include an Accelerated Graphics Port (AGP) or other graphics bus, an Enhanced Industry Standard Architecture (EISA) bus, a front-side bus (FSB), a HYPERTRANSPORT (HT) interconnect, an Industry Standard Architecture (ISA) bus, an INFINIBAND interconnect, a low-pin-count (LPC) bus, a memory bus, a Micro Channel Architecture (MCA) bus, a Peripheral Component Interconnect (PCI) bus, a PCI-Express (PCI-X) bus, a serial advanced technology attachment (SATA) bus, a Video Electronics Standards Association local (VLB) bus, or another suitable bus or a combination of two or more of these. Bus 812 may include one or more buses 812, where appropriate. Although this disclosure describes and illustrates a particular bus, this disclosure contemplates any suitable bus or interconnect.

Herein, reference to a computer-readable storage medium encompasses one or more non-transitory, tangible computer-readable storage media possessing structure. As an example and not by way of limitation, a computer-readable storage medium may include a semiconductor-based or other integrated circuit (IC) (such, as for example, a field-programmable gate array (FPGA) or an application-specific IC (ASIC)), a hard disk, an HDD, a hybrid hard drive (HHD), an optical disc, an optical disc drive (ODD), a magneto-optical disc, a magneto-optical drive, a floppy disk, a floppy disk drive (FDD), magnetic tape, a holographic storage medium, a solid-state drive (SSD), a RAM-drive, a SECURE DIGITAL card, a SECURE DIGITAL drive, or another suitable computer-readable storage medium or a combination of two or more of these, where appropriate. Herein, reference to a computer-readable storage medium excludes any medium that is not eligible for patent protection under 35 U.S.C. §101. Herein, reference to a computer-readable storage medium excludes transitory forms of signal transmission (such as a propagating electrical or electromagnetic signal per se) to the extent that they are not eligible for patent protection under 35 U.S.C. §101. A computer-readable non-transitory storage medium may be volatile, non-volatile, or a combination of volatile and non-volatile, where appropriate.

This disclosure contemplates one or more computer-readable storage media implementing any suitable storage. In particular embodiments, a computer-readable storage medium implements one or more portions of processor 802 (such as, for example, one or more internal registers or caches), one or more portions of memory 804, one or more portions of storage 806, or a combination of these, where appropriate. In particular embodiments, a computer-readable storage medium implements RAM or ROM. In particular embodiments, a computer-readable storage medium implements volatile or persistent memory. In particular embodiments, one or more computer-readable storage media embody software. Herein, reference to software may encompass one or more applications, bytecode, one or more computer programs, one or more executables, one or more instructions, logic, machine code, one or more scripts, or source code, and vice versa, where appropriate. In particular embodiments, software includes one or more application programming interfaces (APIs). This disclosure contemplates any suitable software written or otherwise expressed in any suitable programming language or combination of programming languages. In particular embodiments, software is expressed as source code or object code. In particular embodiments, software is expressed in a higher-level programming language, such as, for example, C, Perl, or a suitable extension thereof. In particular embodiments, software is expressed in a lower-level programming language, such as assembly language (or machine code). In particular embodiments, software is expressed in JAVA, C, or C++. In particular embodiments, software is expressed in Hyper Text Markup Language (HTML), Extensible Markup Language (XML), or other suitable markup language.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. A method comprising:
constructing one or more interconnect structures between an integrated circuit (IC) chip and a substrate, wherein each interconnect structures comprises a plurality of materials;
wherein constructing each interconnect structure comprises:
dividing the interconnect structure into n sections;
giving all the n sections a first material;
recording a current stress level corresponding to the interconnect structure; and
iteratively:
for each of m sections that currently have the first material, where m≤n:
assigning the section a second material; and
determining the current stress level corresponding to the interconnect structure;
selecting, from m determined stress levels, a lowest stress level;
if the selected lowest stress level is less than the recorded stress level, then:
giving a section from the m sections that corresponds to the selected lowest stress level the second material; and
recording the selected lowest stress level;
until the selected lowest stress level is greater than or equal to the recorded stress level.

2. The method of claim 1, wherein n is greater than or equal to 10.

3. The method of claim 1, wherein constructing each interconnect structure further comprises if at least one of the n sections has the second material, then:
for each pair of adjacent first section and second section, wherein the first section has the first material and the second section has the second material:
assigning the first section the second material;
assigning the second section the first material;
determining the current stress level corresponding to the interconnect structure; and
if the determined current stress level is less than the recorded stress level, then:
giving the first section the second material;
giving the second section the first material; and
recording the determined current stress level.

4. The method of claim 1, wherein:
the one or more interconnect structures are formed on the IC chip; and
the IC chip is connected to the substrate by soldering an end of each interconnect structure to the substrate.

5. The method of claim 1, wherein:
the one or more interconnect structures are formed on the substrate; and
the IC chip is connected to the substrate by soldering an end of each interconnect structure to the IC chip.

6. The method of claim 1, wherein each interconnect structure comprises one or more first sections of copper and one or more second sections of tin-silver.

7. One or more computer-readable non-transitory storage media embodying software operable when executed by one or more computer systems to:
construct one or more interconnect structures between an integrated circuit (IC) chip and a substrate, wherein each interconnect structures comprises a plurality of materials;
wherein constructing each interconnect structure comprises:
divide the interconnect structure into n sections;
give all the n sections a first material;
record a current stress level corresponding to the interconnect structure; and iteratively:
for each of m sections that currently have the first material, where m≤n:
assign the section a second material; and
determine the current stress level corresponding to the interconnect structure;
select, from m determined stress levels, a lowest stress level;

if the selected lowest stress level is less than the recorded stress level, then:
give a section from the m sections that corresponds to the selected lowest stress level the second material; and
record the selected lowest stress level;
until the selected lowest stress level is greater than or equal to the recorded stress level.

8. The media of claim 7, wherein n is greater than or equal to 10.

9. The media of claim 7, wherein constructing each interconnect structure further comprises if at least one of the n sections has the second material, then:
for each pair of adjacent first section and second sections wherein the first section has the first material and the second section has the second material:
assign the first section the second material;
assign the second section the first material;
determine the current stress level corresponding to the interconnect structure; and
if the determined current stress level is less than the recorded stress level, then:
give the first section the second material;
give the second section the first material; and
record the determined current stress level.

10. The media of claim 7, wherein:
the one or more interconnect structures are formed on the IC chip; and
the IC chip is connected to the substrate by soldering an end of each interconnect structure to the substrate.

11. The media of claim 7, wherein:
the one or more interconnect structures are formed on the substrate; and
the IC chip is connected to the substrate by soldering an end of each interconnect structure to the IC chip.

12. The media of claim 7, wherein each interconnect structure comprises one or more first sections of copper and one or more second sections of tin-silver.

13. A system comprising:
means for constructing one or more interconnect structures between an integrated circuit (IC) chip and a substrate, wherein each interconnect structures comprises a plurality of materials, the means including;
one or more computer-readable non-transitory storage media embodying software operable when executed by one or more computer systems to:
construct one or more interconnect structures between an integrated circuit (IC) chip and a substrate, wherein each interconnect structures comprises a plurality of materials, and
wherein constructing each interconnect structure comprises:
divide the interconnect structure into n sections;
give all the n sections a first material;
record a current stress level corresponding to the interconnect structure; and iteratively:
for each of m sections that currently have the first material, where m≤n:
assign the section a second material; and
determine the current stress level corresponding to the interconnect structure;
select, from m determined stress levels, a lowest stress level;
if the selected lowest stress level is less than the recorded stress level, then:
give a section from the m sections that corresponds to the selected lowest stress level the second material; and
record the selected lowest stress level;
until the selected lowest stress level is greater than or equal to the recorded stress level.

* * * * *

UNITED STATES PATENT AND TRADEMARK OFFICE
CERTIFICATE OF CORRECTION

| | | |
|---|---|---|
| PATENT NO. | : 8,633,592 B2 | Page 1 of 1 |
| APPLICATION NO. | : 13/190761 | |
| DATED | : January 21, 2014 | |
| INVENTOR(S) | : Lee et al. | |

It is certified that error appears in the above-identified patent and that said Letters Patent is hereby corrected as shown below:

Title page, (73) Assignee, delete "Cisco Technology, Inc., San Jose, CA (US)" and insert --Fujitsu Limited, Kawasaki-shi, Japan--.

Signed and Sealed this
Fifth Day of January, 2016

Michelle K. Lee
*Director of the United States Patent and Trademark Office*